(12) United States Patent
Wang et al.

(10) Patent No.: US 7,592,265 B2
(45) Date of Patent: Sep. 22, 2009

(54) METHOD OF TRIMMING A HARD MASK LAYER, METHOD FOR FABRICATING A GATE IN A MOS TRANSISTOR, AND A STACK FOR FABRICATING A GATE IN A MOS TRANSISTOR

(75) Inventors: Meng-Jun Wang, Taichung County (TW); Yi-Hsing Chen, Changhua County (TW); Min-Chieh Yang, Kao-Hsiung (TW); Jiunn-Hsiung Liao, Tainan Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 148 days.

(21) Appl. No.: 11/620,028

(22) Filed: Jan. 4, 2007

(65) Prior Publication Data
US 2008/0164526 A1    Jul. 10, 2008

(51) Int. Cl.
*H01L 21/302* (2006.01)
*H01L 21/461* (2006.01)

(52) U.S. Cl. ........................ 438/736; 438/950; 438/947; 438/671; 257/E21.488; 257/E21.492; 257/E21.483; 216/51; 216/47

(58) Field of Classification Search ............... 438/736, 438/947, 950, 671; 257/E21.488, E21.49, 257/E21.493, E21.483, E21.492; 216/47, 216/49, 51
See application file for complete search history.

(56) References Cited

U.S. PATENT DOCUMENTS

| | | | |
|---|---|---|---|
| 6,699,641 B1* | 3/2004 | Hellig et al. | 430/312 |
| 2005/0164478 A1* | 7/2005 | Chan et al. | 438/585 |
| 2008/0038927 A1* | 2/2008 | Yamaguchi et al. | 438/706 |

* cited by examiner

*Primary Examiner*—Caridad M Everhart
(74) *Attorney, Agent, or Firm*—Winston Hsu

(57) ABSTRACT

A method of trimming hard mask is provided. The method includes providing a substrate, a hard mask layer, and a tri-layer stack on the substrate. The tri-layer stack includes a top photo resist layer, a silicon photo resist layer, and a bottom photo resist layer. The top photo resist layer, the silicon photo resist layer, the bottom photo resist layer, and the hard mask layer are patterned sequentially. A trimming process is performed on the hard mask layer. The bottom photo resist layer of the present invention is thinner and loses some height in the etching process, so the bottom photo resist layer will not collapse.

20 Claims, 10 Drawing Sheets

METHOD OF TRIMMING A HARD MASK LAYER, METHOD FOR FABRICATING A GATE IN A MOS TRANSISTOR, AND A STACK FOR FABRICATING A GATE IN A MOS TRANSISTOR

BACKGROUND OF THE INVENTION

1. Field of the Invention

The present invention relates to a method for trimming a hard mask layer. More particularly, the present invention relates to a method for forming a gate of a MOS transistor using a tri-layer photo resist layer for improving the trimming of a hard mask layer.

2. Description of the Prior Art

With the advancing technology of the semiconductor industry, integrated circuits are being developed to increase the current computing and storage capability. As predicted by Moore's law, the number of transistors doubles every 18 months. The process of semiconductor evolves from 0.18 µm of 1999, 0.13 µm of 2001, 90 nm (0.09 µm) of 2003 to 65 nm (0.065 µm) of 2005 and is approaching 45 nm.

During the process of manufacturing metal oxide semiconductor transistors (MOS transistors), the formation of a conductive gate plays an important role. In order to meet the demand of miniaturization of the semiconductor industry, the current channel length under the gate must meet the standard of 45 nm. To meet the 45 nm channel length requirement, it is crucial to control the critical dimension (CD) during the process of exposure of the gate so as to control the line width of the conductive layer (poly-Si layer for example) after the etching process. Because the current lithographic tool techniques are incapable of obtaining the ideal CD, trimming methods are employed in some prior art methods to reduce the size of gate line width. However, most photo resist layers useful in the current gate exposure process are 193 nm photo resist layers which are intrinsically less resistant to the etching condition than 365 nm photo resist layers are on account of acrylic and cycloalkenyl polymer composition in contrast to 365 nm photo resist layers composed of aryl moiety. Furthermore, the thickness of 193 nm photo resist layers reduces as the exposure wavelength shortens. Under the dual disadvantages of poor etching resistance and less and less thickness, it is hard for 193 nm photo resist layers to meet the minimum requirement of 30 nm owing to the available thickness being 10 nm or less during the trimming process on 193 nm photo resist layers.

In order to overcome the problem, the current techniques deals with the problems by transferring the pattern on the photo resist layer to the hard mask beneath the photo resist layer. After being patterned, the hard mask is ready for the trimming process to reduce the gate line width. In addition, the hard mask must have high etching selectivity to the conductive layer used in forming gate layer. Accordingly, the trimmed hard mask is ready to be the template for etching transfer process to define the line width of gate layer.

Please refer to FIG. 1 to FIG. 3. FIG. 1 to FIG. 3 illustrate the perspective view of the process of trimming a hard mask of the prior art. Please refer to FIG. 1. There are several shallow trench isolations (STI 102) in substrate 100. A dielectric layer 104, a conductive layer 106 and a hard mask layer 108 composed of oxide materials are formed on the substrate 100 sequentially. Following that, a bottom anti-reflective coating (BARC) 110 and an imaging layer 112 are formed on hard mask layer 108 sequentially by spin coating technique. Both the bottom anti-reflective coating (BARC) 110 and imaging layer 112 together serve as a double photo resist layer 114. The reason of using double photo resist layer 114 in stead of single-layer is to increase the resolution of lithography. For the current technology, the BARC 110 is usually a 365 nm photo resist layer and the imaging layer 112 may be a 193 nm photo resist layer. In addition, the imaging layer 112 is formed by spin-coating which solves the problem of uneven thickness of the imaging layer 112. Moreover, the double photo resist layer 114 allows a thinner imaging layer 112, and a thinner imaging layer 112 may improve the focus latitude in lithography and effectively control CD. That is why the double photo resist layer 114 is so popular.

Please refer to FIG. 2. The imaging layer 112 is patterned by a photolithographic process. Then the BARC 110 is patterned by using the patterned imaging layer 112 as an etching mask. Because the imaging layer 112 is less resistant to etching than an aryl-composed 365 nm photo resist layer is due to the imaging layer 112 being a 193 nm photo resist layer which is composed of acrylic and cycloalkenyl polymers, some thickness of the imaging layer 112 is depleted when the BARC 110 is patterned. After the BARC 110 is patterned, the patterned imaging layer 112 thereon may be optionally removed. Later, an etching procedure is performed to pattern the hard mask layer 108 and to form the desired pattern of openings 200.

Please refer to FIG. 3. Now a trimming procedure is performed. The trimming procedure is a plasma etching procedure using $CF_4$ and $CHF_3$ as etching gases whose ratio ($CF_4/CHF_3$) is 80/15 to widen openings 200 and to narrow the width of the hard mask layer 108 for trimming.

However, because the BARC 110 is etched away faster than the hard mask layer 108 is by $CF_4$ and $CHF_3$, the hard mask layer 108 gets twisted, and part of the hard mask layer 108 which is close to the BARC 110 etched away more than that which is close to the conductive layer 106. Using the flawed hard mask layer 108 as an etching mask for etching conductive layer 106 is doomed to produce a flawed gate structure. Moreover, the BARC 110 is prone to line collapse during the trimming procedure and the following etching on conductive layer, which would destroy the entire process or the results.

Accordingly, it is important to develop a better method for trimming hard masks to form the gate of CMOS transistors with ideal gate length.

SUMMARY OF THE INVENTION

The present invention provides a method for trimming hard mask layers using a tri-layer photo resist layer for improving the trimming of hard mask layers to form the gate of MOS transistors. The present invention solves the aforesaid problems.

One preferred embodiment of the present invention provides a method for trimming a hard mask layer, comprising providing a substrate and a hard mask layer on the substrate; forming a tri-layer stack comprising a top photo resist layer, a silicon photo resist layer and a bottom photo resist layer on the hard mask layer; patterning the top photo resist layer; etching the silicon photo resist layer by using the patterned top photo resist layer as an etching mask to pattern the silicon photo resist layer to form a first opening of a first width on the bottom thereof; removing the top photo resist layer; etching the bottom photo resist layer by using the patterned silicon photo resist layer as an etching mask; etching the hard mask layer by using the patterned bottom photo resist layer as an etching mask to form a second opening of the first width; and performing a trimming procedure to make the second opening with a second width larger than the first width.

Another preferred embodiment of the present invention provides a method for forming a gate of a MOS transistor, comprising providing a substrate with several shallow trench isolations (STI) therein; forming a dielectric layer, a conductive layer and a hard mask layer on the substrate sequentially; forming a tri-layer stack comprising a top photo resist layer, a silicon photo resist layer, and a bottom photo resist layer on the hard mask layer; patterning the top photo resist layer; etching the silicon photo resist layer by using the patterned top photo resist layer as an etching mask to pattern the silicon photo resist layer to form a first opening of a first width on the bottom thereof; removing the top photo resist layer; etching the bottom photo resist layer by using the patterned silicon photo resist layer as an etching mask; etching the hard mask layer by using the patterned bottom photo resist layer as an etching mask to form a second opening of the first width; performing a trimming procedure to make the second opening with a second width larger than the first width; and etching the conductive layer by using the hard mask layer with the second openings as an etching mask to form a gate.

Still another preferred embodiment of the present invention provides a stack structure for forming a gate of a MOS transistor, comprising a substrate comprising a plurality of shallow trench isolations therein; a dielectric layer, a conductive layer and a hard mask layer formed on the substrate in sequence; and a tri-layer stack comprising a top photo resist layer, a silicon-containing photo resist layer and a bottom anti-reflective coating (BARC) on the hard mask layer, wherein the silicon-containing photo resist layer comprises 10-30% silicon and the hard mask layer has a high etching selectivity ratio to the conductive layer.

Because the lithographic procedure of the present invention is performed with a photo resist layer of a tri-layer stack, the exposure procedure may accomplish a better CD. Besides, because the silicon-containing photo resist layer is completely depleted during the etching procedure on patterning the bottom anti-reflective coating (BARC), the silicon-containing photo resist layer does not interfere with the following procedure of patterning the hard mask layer. Furthermore, the BARC is not apt to line collapse during the following trimming procedure or the etching procedure on the conductive layer to form the gate because the BARC is thinner than that of the prior art due to the improved photo resist layer of tri-layer stack structure of the present invention in lithography, plus the thickness of the BARC is greatly depleted when the hard mask layer is patterned by using the BARC as an etching mask. Accordingly, the present invention provides a desirable method for trimming hard mask layers to form the gate of MOS transistors with ideal gate length.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
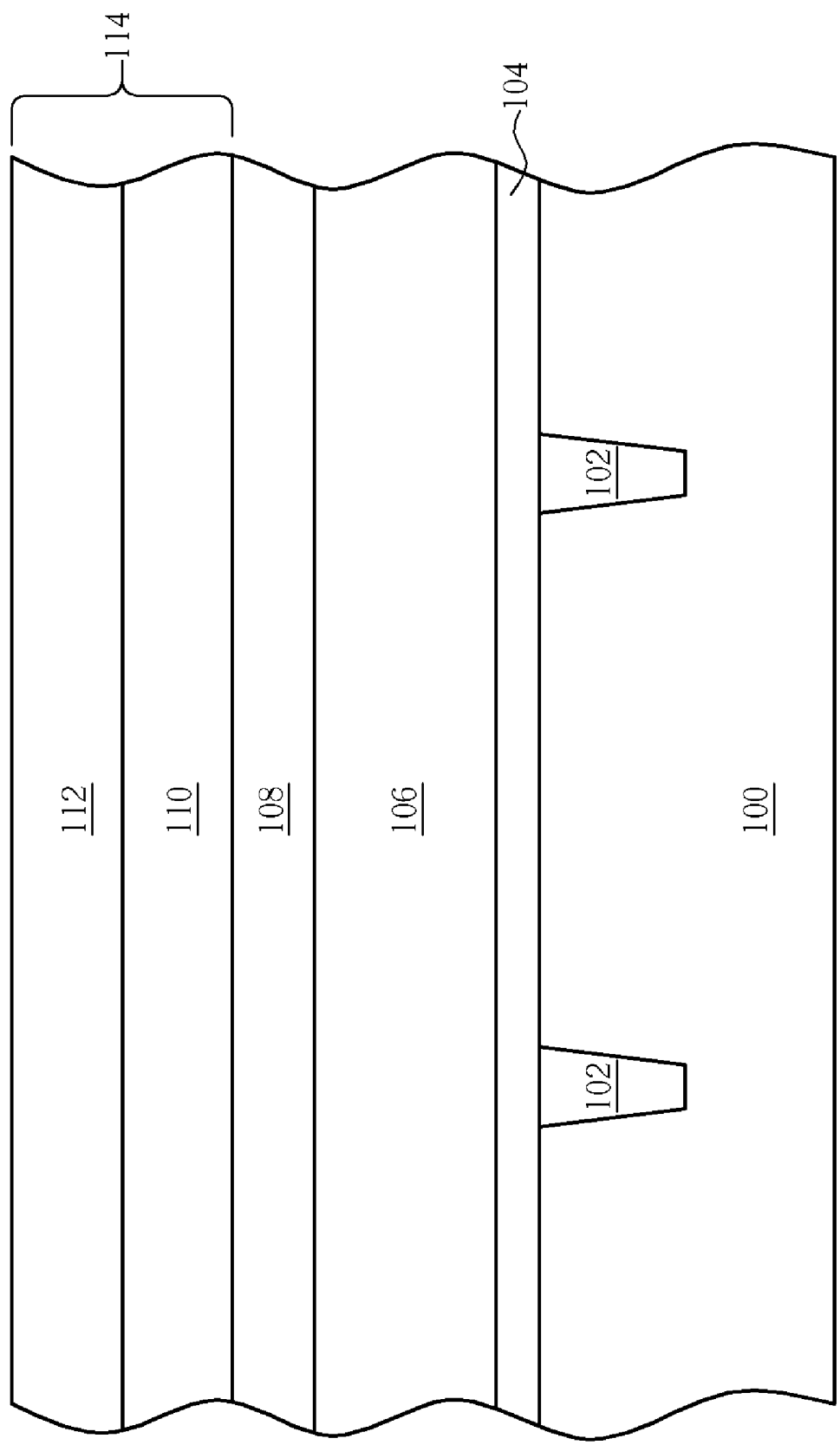
FIG. 1 to FIG. 3 illustrate the perspective view of the process of trimming a hard mask of the prior art.
Figure 2:
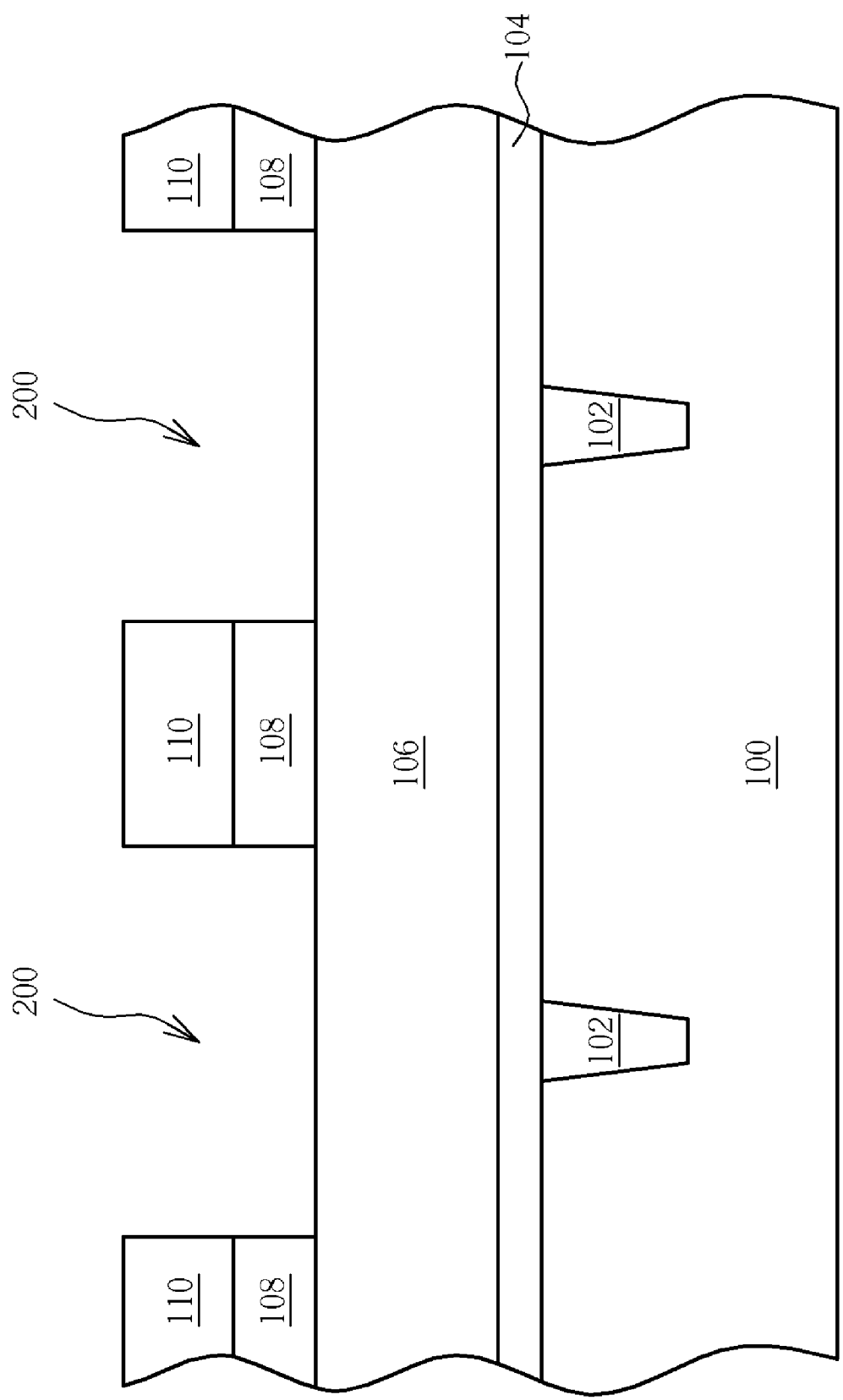
Figure 3:
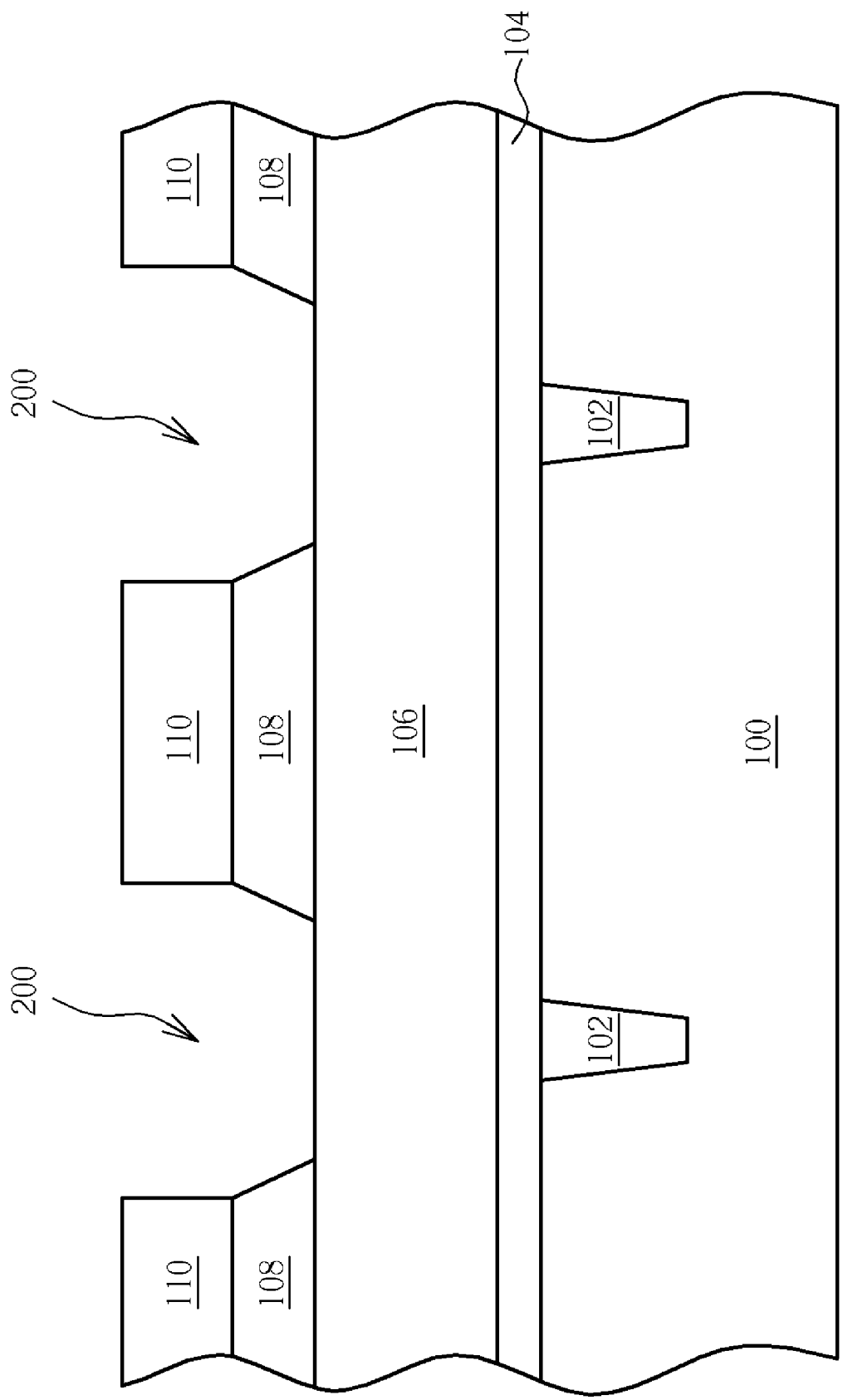

Please refer to FIG. 4 to FIG. 10. FIG. 4 to FIG. 10 illustrate the perspective views of the process for forming the gate of MOS transistors of the present invention. Please refer to FIG. 4. First a substrate 400 is provided. The substrate 400 is usually a single-Si, or may be silicon on insulation (SOI), or other applicable materials, such as strained silicon, strained silicon-on-insulator, silicon-germanium, strained silicon-germanium, silicon-germanium on insulator, germanium, strained germanium, germanium on insulator (GeOI), strained germanium on insulator, strained semiconductor, compound semiconductor, compound semiconductor, and multi-layers semiconductor.

The substrate 400 comprises an isolation structure comprising several shallow trench isolations (STI) 401 composed of dielectric materials such as $SiO_2$ or low-k dielectric materials, or field oxide. Later a dielectric layer 402 and a conductive layer 404 are formed on the substrate 400 sequentially. Generally speaking, the dielectric layer 402 may be formed by oxidation, chemical vapor deposition (CVD), or plasma enhanced chemical vapor deposition (PECVD). The material may be oxide, oxy-nitride, nitrogen-containing dielectric materials or a combination thereof, and a multi-layer structure. In this embodiment, the dielectric layer 402 is a silicon oxide layer made from thermo-oxidation on the substrate 400. The conductive layer 404 may also be formed by chemical vapor deposition (CVD) or plasma enhanced chemical vapor deposition (PECVD). In this embodiment, the conductive layer 404 is made from poly-Si.

After the conductive layer 404 is formed, a hard mask layer 406 is formed on the conductive layer 404. In this embodiment, the hard mask layer 406 is an oxide layer. Generally speaking, the hard mask layer 406 may also be made of any one of SiON, $Si_xN_y$, $SiO_2$, TEOS or a combination thereof. Please notice that the hard mask layer 406 must have high etching selectivity ratio to the conductive layer 404 used for forming the gate.

Then a multi-layer stack structure layer such as a tri-layer stack layer 414 is formed on the hard mask layer 406. From top to bottom, the tri-layer stack layer 414 may comprises a 193 nm photo resist layer 412, a silicon-containing photo resist layer 410 as silicon photo resist layer and a bottom anti-reflective coating (BARC) 408 as a bottom photo resist layer on the hard mask layer 406 sequentially. In this embodiment, the BARC 408 is a 365 nm (I-line) photo resist layer. The silicon-containing photo resist layer 410 comprises 10-30% silicon. Please notice that the thickness of both the 193 nm photo resist layer 412 and the BARC 408 required in the tri-layer stack layer 414 is thinner. A thinner 193 nm photo resist layer 412 may improve focus latitude in lithography, and control CD effectively. In addition, a thinner 193 nm photo resist layer 412 may avoid line collapse.

Figure 4:
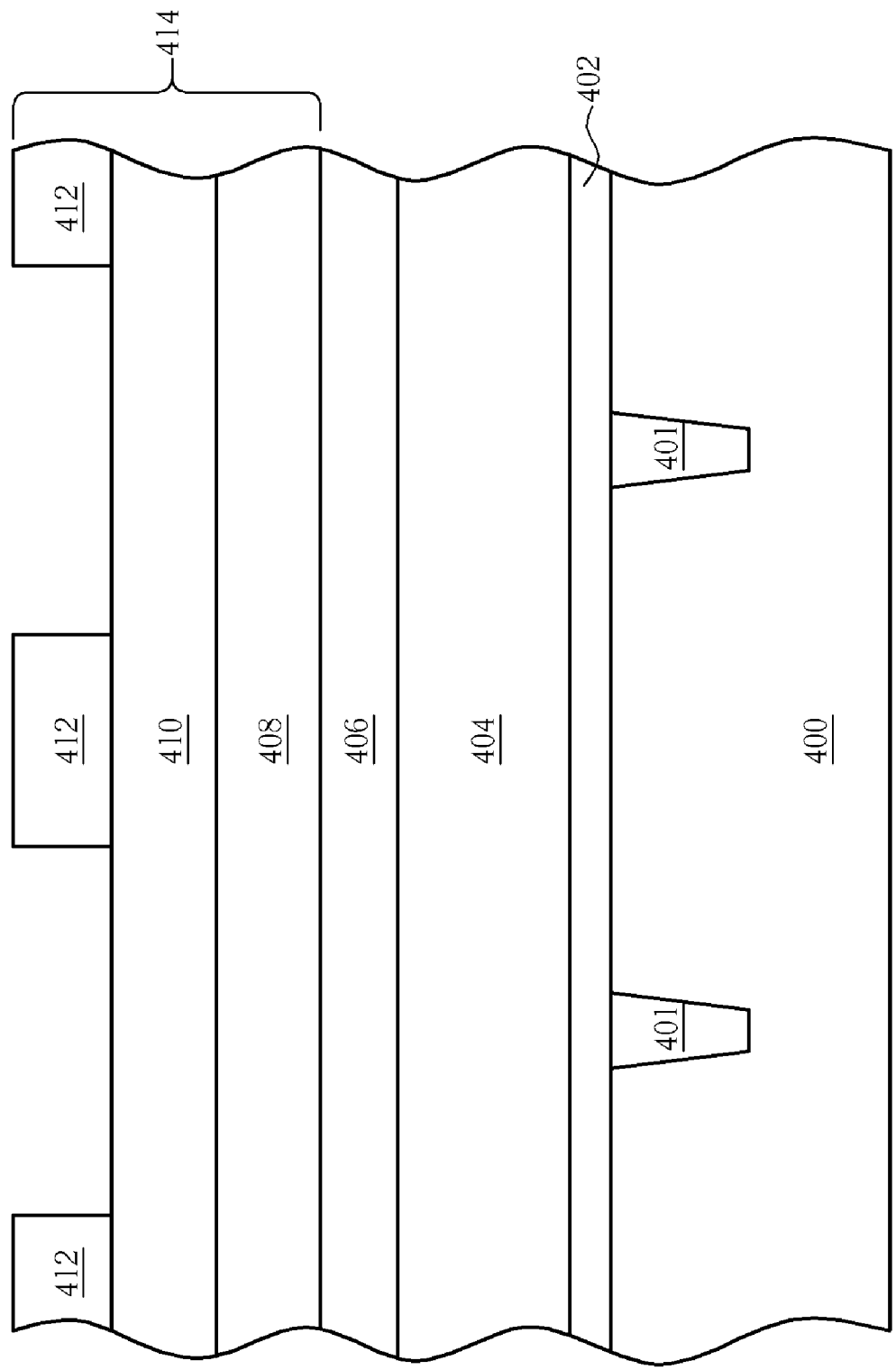
FIG. 4 to FIG. 10 illustrate the perspective view of the process for forming the gate of MOS transistors of the present invention.

The tri-layer stack layer 414 is formed on the conductive layer 404, then followed by a photolithographic process to pattern the 193 nm photo resist layer 412 as shown in FIG. 4.

Figure 5:
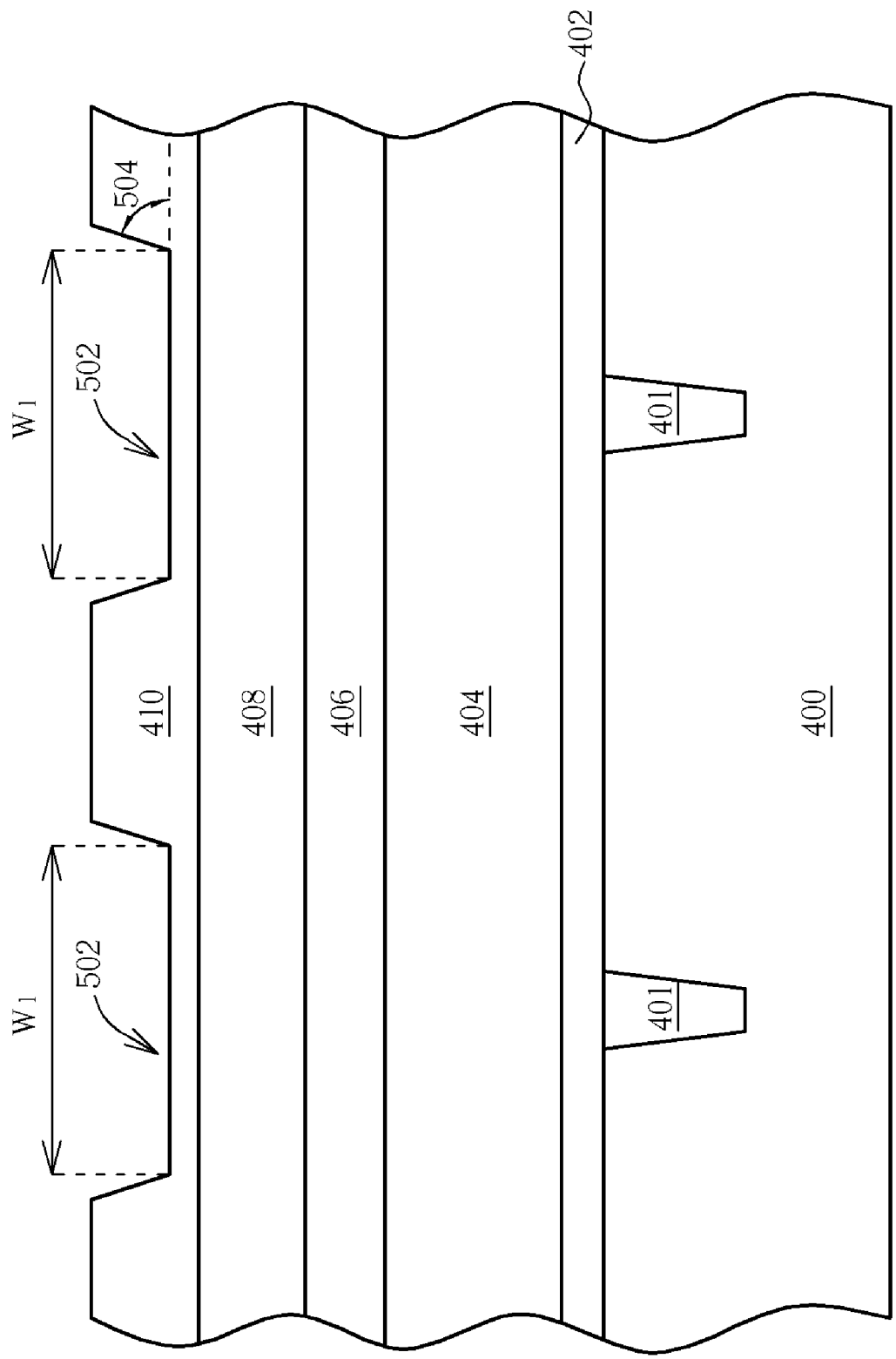

Please refer to FIG. 5. A dry development or etching procedure is performed using the patterned 193 nm photo resist layer as an etching mask. In this embodiment the silicon-containing photo resist layer 410 is patterned by an etching procedure. Because the silicon-containing photo resist layer 410 comprises 10-30% silicon, the patterned silicon-containing photo resist layer 410 after etching has openings 502, and the sidewalls of openings 502 are all tapered (taper 504). In other words, the width W1 of the bottom of the openings 502 is smaller than that of the top. Please notice that the bottom of the openings 502 doesn't expose the BARC 408, i.e. the procedure which patterns the silicon-containing photo resist layer 410 using the patterned 193 nm photo resist layer 412 as an etching mask does not etch through the entire silicon-containing photo resist layer 410, which helps to keep the structural integrity of the BARC 408. Later, the remaining 193 nm photo resist layer 112 is removed.

Figure 6:
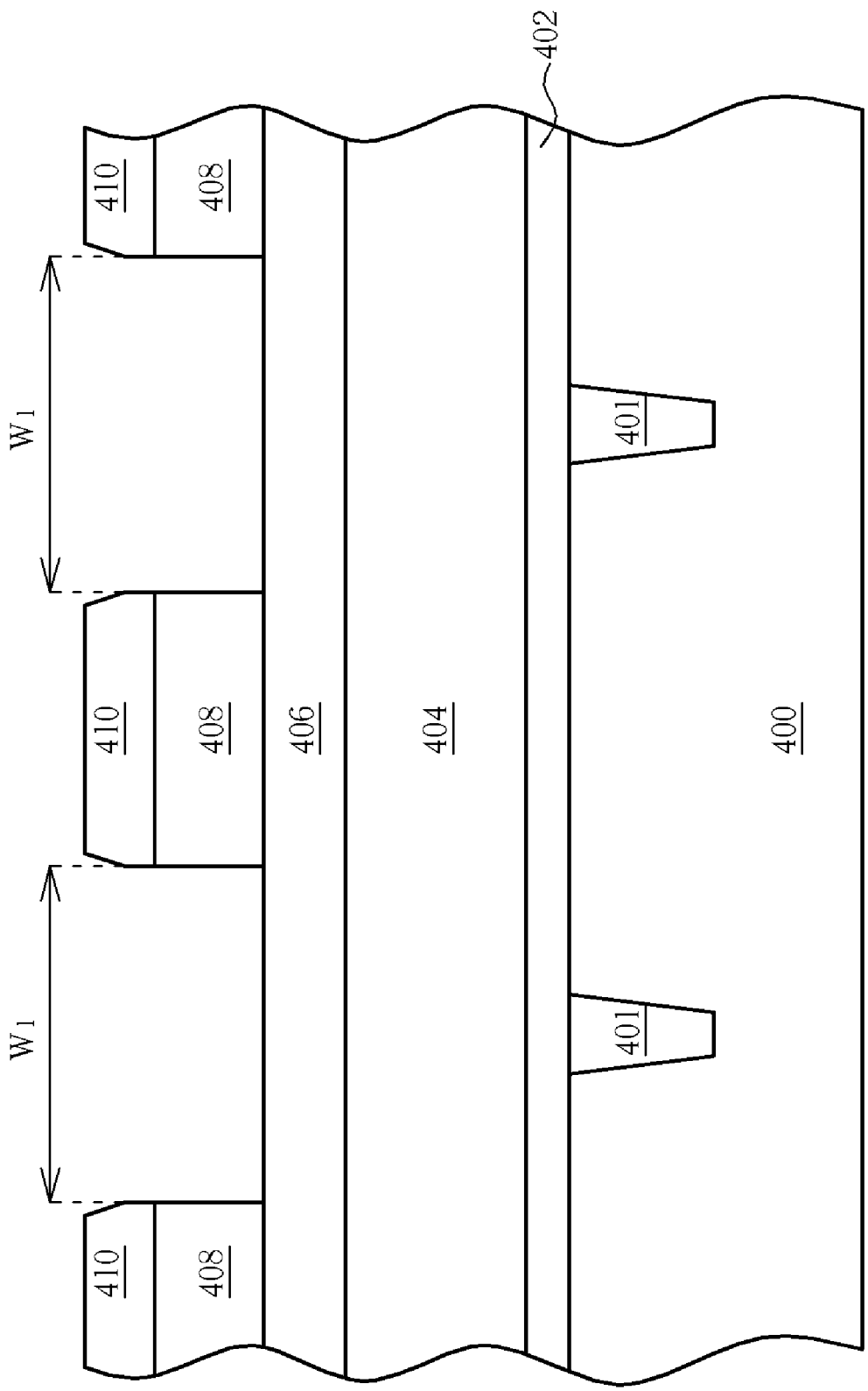

Please refer to FIG. 6. The silicon-containing photo resist layer 410 is etched using the patterned silicon-containing photo resist layer 410 as an etching mask to expose the BARC 408. In this etching procedure the thickness of the silicon-containing photo resist layer 410 is entirely reduced. In this procedure the etched width is the width W1 of the bottom of the openings 202 as a reference. Afterwards, the BARC 408 is etched using the etched-through silicon-containing photo resist layer 410 as an etching mask to expose the hard mask layer 406 and to pattern the BARC 408. In patterning the BARC 408 the etching procedure will certainly deplete some of the remaining silicon-containing photo resist layer 410. Generally, the silicon-containing photo resist layer 410 would be completely depleted without any remainder. In case the silicon-containing photo resist layer 410 is not completely depleted, it can be removed by a further etching procedure or a washing procedure. If the silicon-containing photo resist layer 410 is completely depleted anyhow, no remaining silicon-containing photo resist layer 410 would interfere with the following etching procedure.

Figure 7:
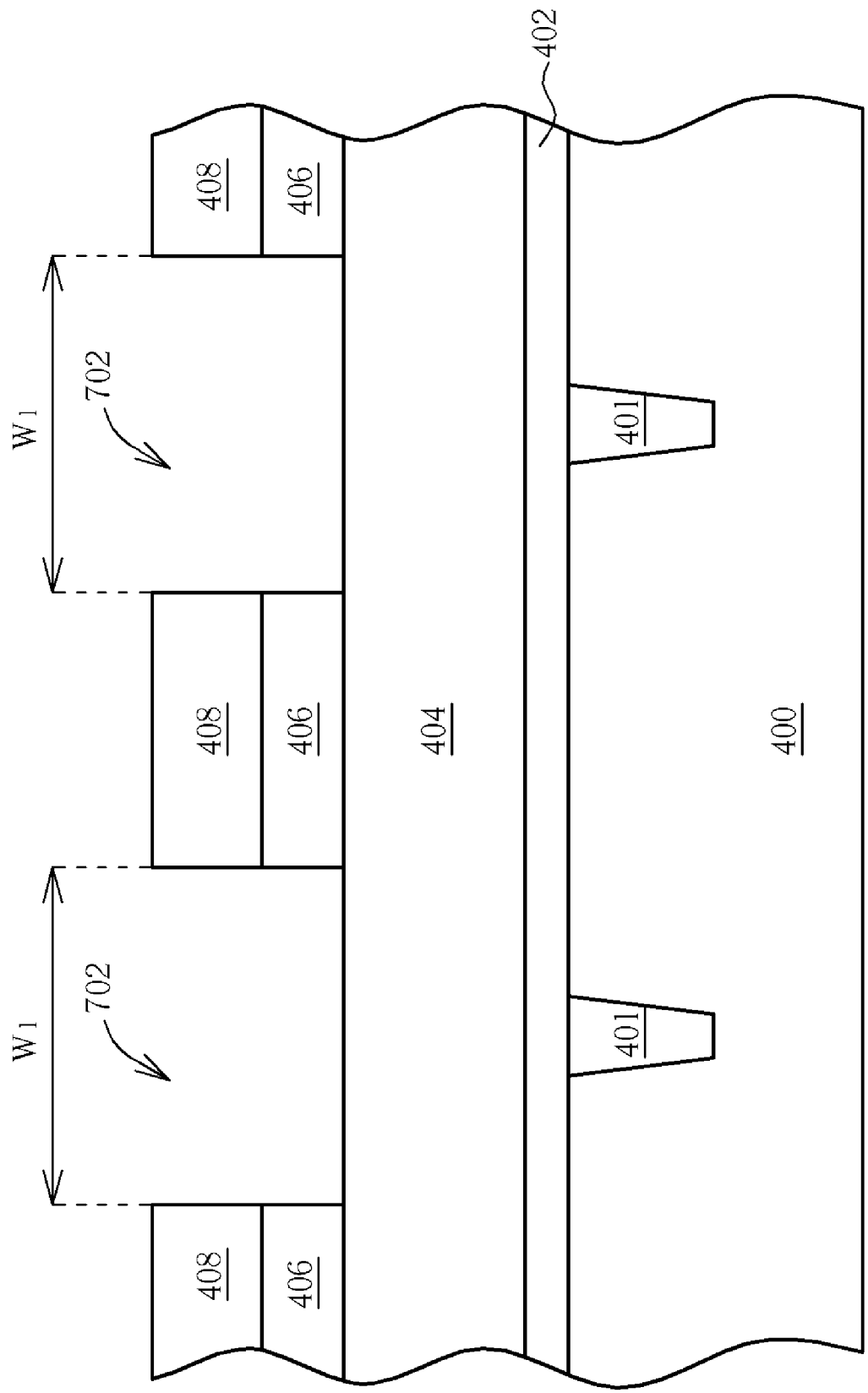

Please refer to FIG. 7. The hard mask layer 406 is etched by using the patterned BARC 408 as an etching mask to pattern the hard mask layer 406 and to form openings 702 of the width W1. Because the hard mask layer 406 is defined by using the patterned BARC 408 as an etching mask, the thickness of the BARC 408 would more or less be depleted.

Figure 8:
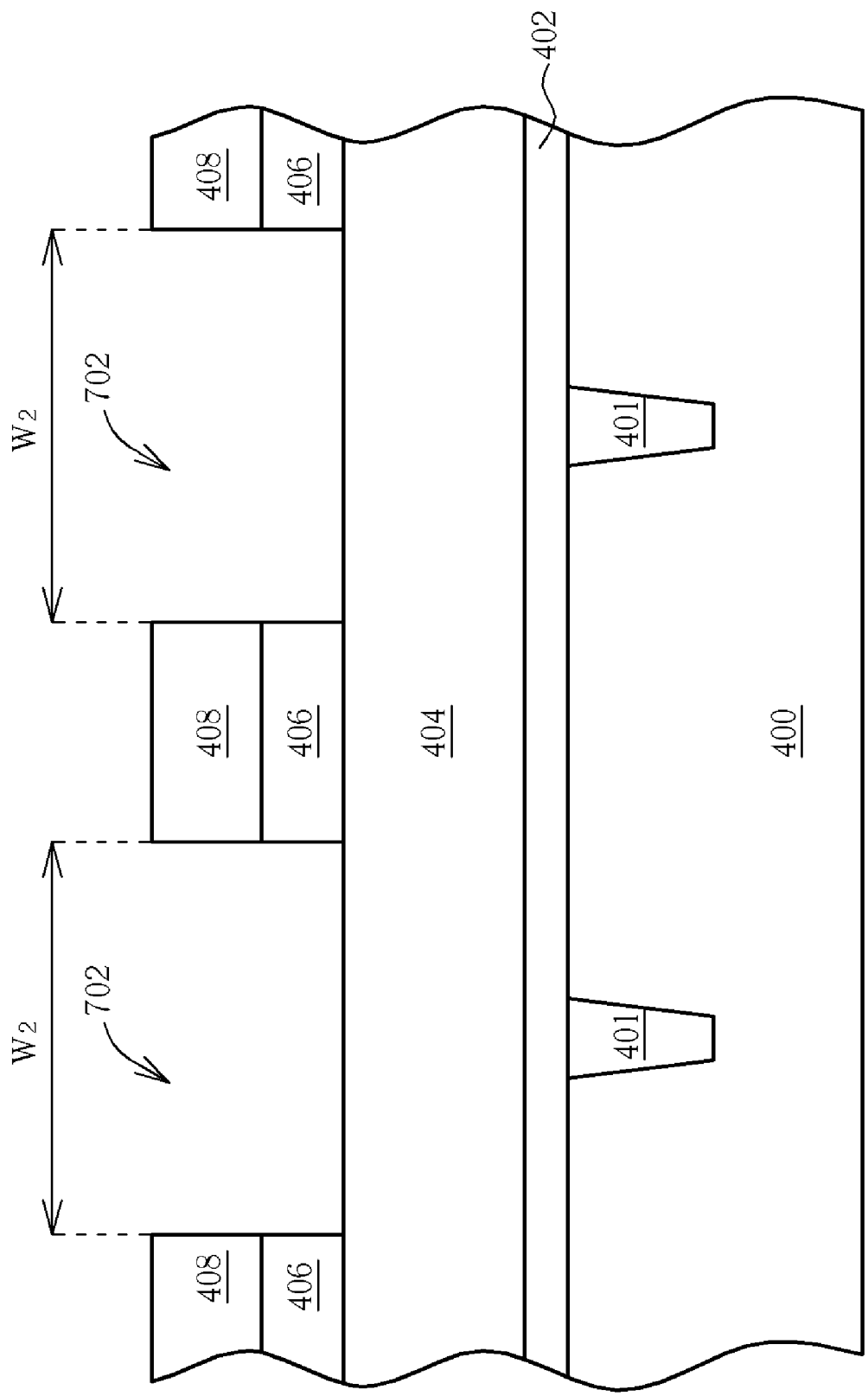

Please refer to FIG. 8, which shows the patterned hard mask layer 406 and the BARC 408 on the conductive layer 404. Between two patterned hard mask layer 406 and BARC 408 stack structures are openings 702 of the width W1. Now a trimming process, i.e. trim down etching process, is performed. The trimming process may be a plasma etching process. For example, $CF_4$ and $CHF_3$ may be used as etching gases whose ratio ($CF_4/CHF_3$) is 50/45. In this stage the trimming process is focused on both the patterned hard mask layer 406 and the BARC 408 in order to accomplish a better result of line edge shortage than if the hard mask layer 406 is trimmed alone. After the trimming process is completed, the width W1 of the openings 702 between two patterned hard mask layer 406 and BARC 408 stack structures widens to W2. Additionally, because the thickness of the BARC 408 is depleted when the hard mask layer 406 is patterned, the BARC 408 is not liable to line collapse in the trimming process.

Figure 9:
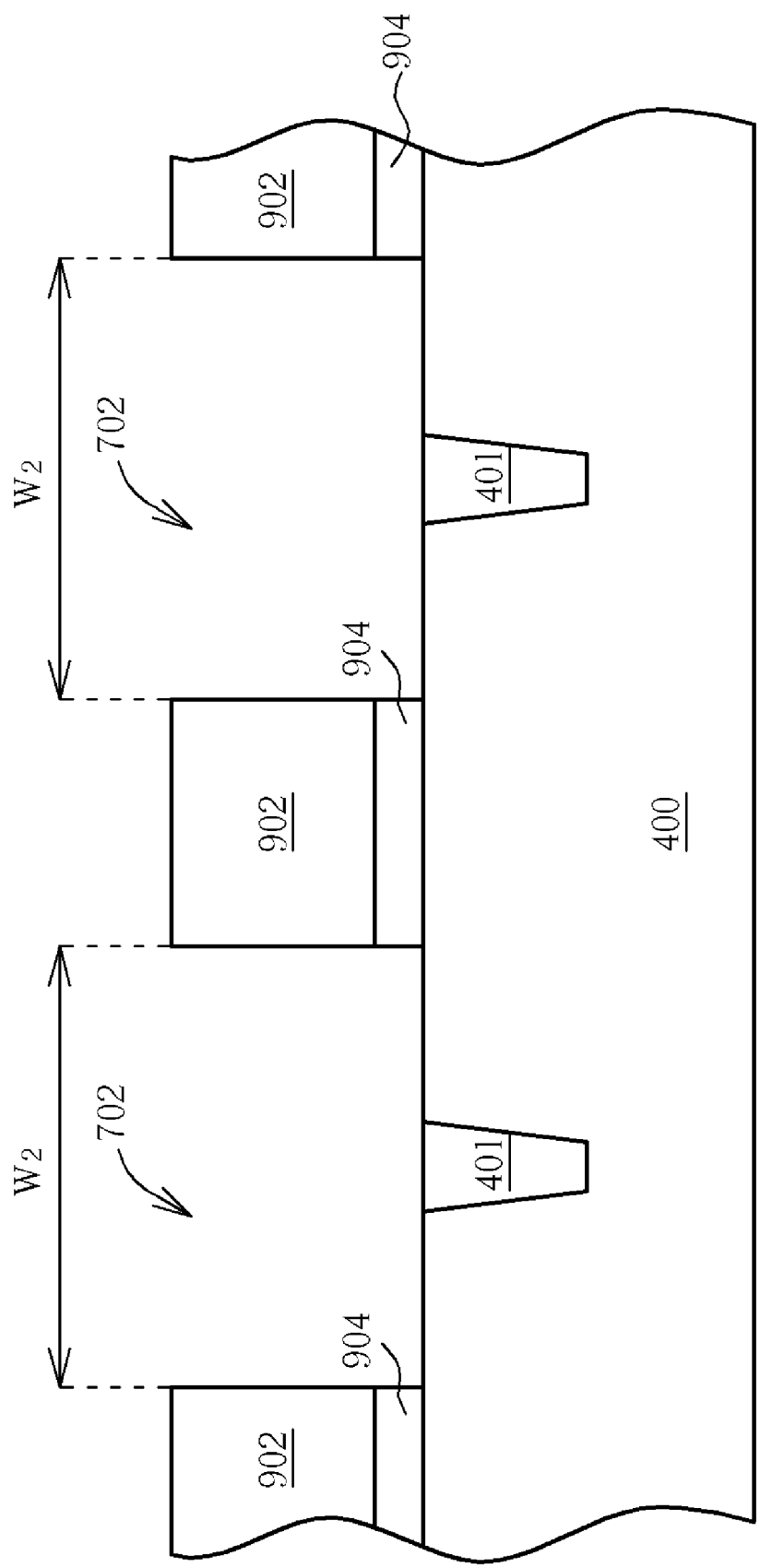

Please refer to FIG. 9. Because the hard mask layer 406 has a high etching selectivity ratio to the conductive layer 404, the BARC 408 and the hard mask layer 406 after the trimming process are used as the templates for an etching transfer step to define and to etch the pattern of the gate 902 in the conductive layer 404. Afterwards, the dielectric layer 402 is etched to form a gate dielectric layer 904. Following this, the BARC 408 and the hard mask layer 406 are removed.

Figure 10:
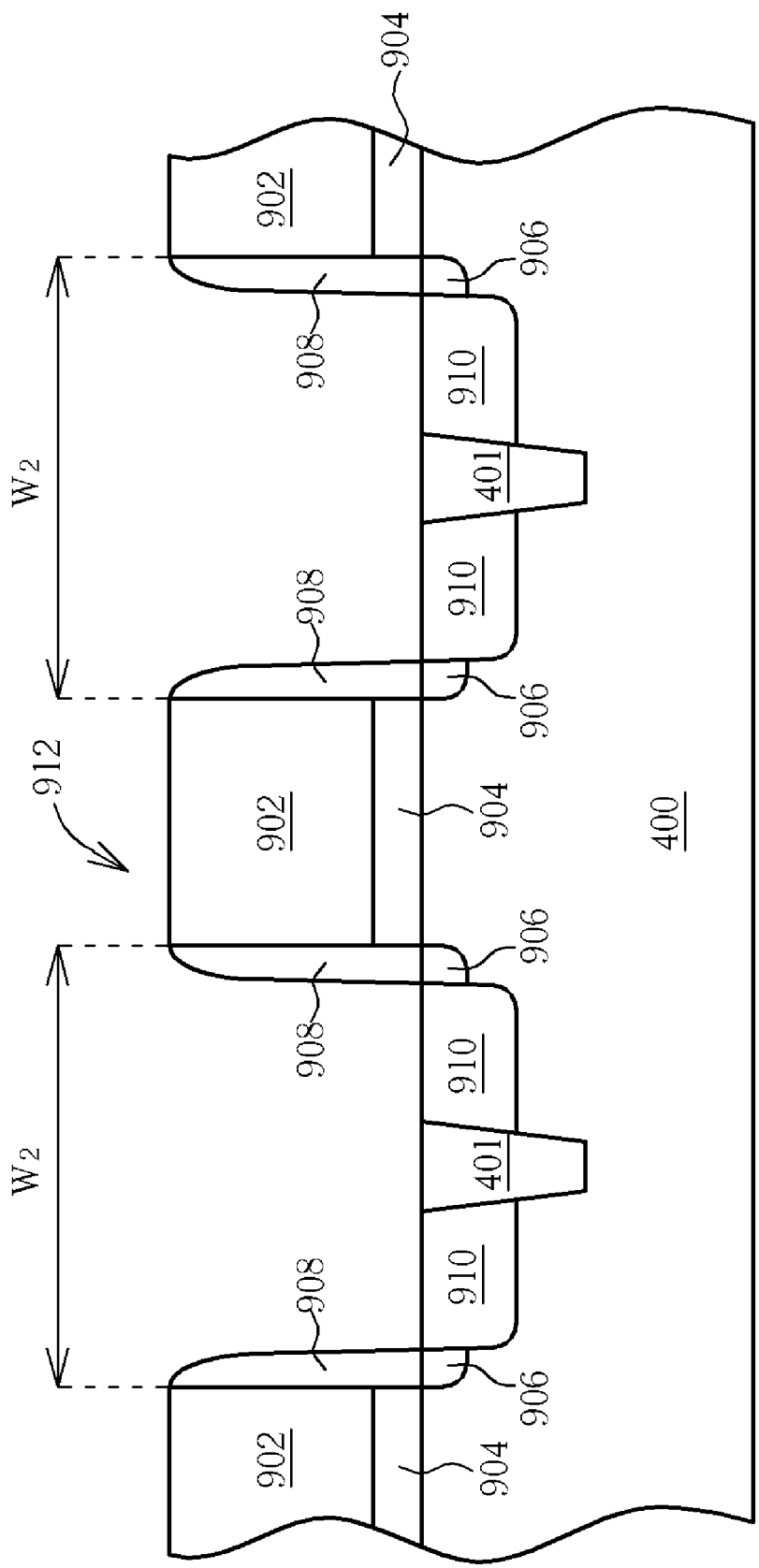

Please refer to FIG. 10. Now followed by an ion implantation, a lightly doped drain (LDD) 906 is formed in the substrate 400 of the both sides of the gate 902 and the gate dielectric layer 904. Later a dielectric layer (not shown) is deposited on the substrate 400 and the gate 902, and a back-etching process is performed to form spacers 908 surrounding the gate 902 and the gate dielectric layer 904. Then an ion implantation is performed by using the gate 902 and the spacers 908 as a mask to form a source/drain 910 in the substrate 400 at both sides of the gate 902, the gate dielectric layer 904 and the spacers 908 and to form CMOS transistors 912. If necessary, a self-aligned silicide process may be optionally performed or a contact etch stop layer (CESL) with a specific stress condition may be optionally formed to manufacture a strained silicon channel CMOS transistor depending on the product specification or functional requirements. An interlayer dielectric layer (ILD) and the desired metal interconnect may be formed to complete the process.

Because the lithographic procedure of the present invention is performed with a photo resist layer of a tri-layer stack, the exposure procedure may accomplish a better CD. Besides, because the silicon-containing photo resist layer is completely depleted during the etching procedure on patterning the bottom anti-reflective coating (BARC), the silicon-containing photo resist layer does not interfere with the following procedure of patterning the hard mask layer. Furthermore, the BARC is not apt to line collapse during the following trimming procedure or the etching procedure on the conductive layer to form the gate because the BARC is thinner than that of the prior art due to the improved photo resist layer of tri-layer stack structure of the present invention in lithography, plus the thickness of the BARC is greatly depleted when the hard mask layer is patterned by using the BARC as an etching mask. Accordingly, the present invention provides a desirable method for trimming the hard mask layers to form the gate of MOS transistors with ideal gate length.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of trimming a hard mask layer, comprising:
   providing a substrate and a hard mask layer on said substrate;
   forming a multi-layer stack comprising at least a top photo resist layer, a silicon photo resist layer, and a bottom photo resist layer on said hard mask layer;
   patterning said top photo resist layer;
   etching said silicon photo resist layer by using said patterned top photo resist layer as an etching mask to pattern said silicon photo resist layer to form a first opening of a first width on the bottom thereof;
   removing said top photo resist layer;
   etching said bottom photo resist layer sequentially by using said patterned silicon photo resist layer as an etching mask;
   etching said hard mask layer sequentially by using said patterned bottom photo resist layer as an etching mask to form a second opening of said first width; and
   trimming said hard mask layer to make said second opening with a second width larger than said first width.

2. The method of claim 1 wherein said substrate comprises single crystal Si and silicon on insulator (SOI).

3. The method of claim 1 wherein the sidewalls of said first opening are tapered and the width of the top of said first opening is larger than said first width.

4. The method of claim 1 wherein said top photo resist layer comprises a 193 nm photo resist layer and said silicon photo resist layer comprises a silicon-containing photo resist layer and said bottom photo resist layer comprises a bottom anti-reflective coating (BARC).

5. The method of claim 4 wherein said silicon-containing photo resist layer comprises 10-30% silicon.

6. The method of claim 4 wherein said bottom anti-reflective coating comprises a 365 nm photo resist layer.

7. The method of claim 1 wherein said first opening does not expose said bottom photo resist layer.

8. The method of claim 7 wherein after forming said first opening, the method further comprises:

etching said silicon photo resist layer comprising said first opening to expose said bottom photo resist layer.

9. The method of claim 1 wherein $CF_4$ and $CHF_3$ are used as etching gases in trimming said hard mask layer.

10. The method of claim 9 wherein the ratio of $CF_4$ to $CHF_3$ is 50 to 45.

11. A method of forming a gate of a MOS transistor, comprising: providing a substrate;

forming a dielectric layer, a conductive layer and a hard mask layer on said substrate;

forming a multi-layer stack comprising at least a top photo resist layer, a silicon photo resist layer, and a bottom photo resist layer on said hard mask layer;

patterning said top photo resist layer;

etching said silicon photo resist layer by using said patterned top photo resist layer as an etching mask to pattern said silicon photo resist layer to form a first opening of a first width on the bottom thereof;

removing said top photo resist layer;

etching said bottom photo resist layer sequentially by using said patterned silicon photo resist layer as an etching mask;

etching said hard mask layer sequentially by using said patterned bottom photo resist layer as an etching mask to form a second opening of said first width;

trimming said hard mask layer to make said second opening with a second width larger than said first width; and etching said conductive layer by using said hard mask layer with said second opening as an etching mask to form a gate.

12. The method of claim 11 wherein said substrate comprises single crystal Si and silicon on insulator (SOI).

13. The method of claim 11 wherein the sidewalls of said first opening are tapered and the width of the top of said first opening is larger than said first width.

14. The method of claim 11 wherein $CF_4$ and $CHF_3$ are used as etching gases in trimming said hard mask layer.

15. The method of claim 14 wherein the ratio of $CF_4$ to $CHF_3$ is 50 to 45.

16. The method of claim 11 wherein said top photo resist layer comprises a 193 nm photo resist layer and said silicon photo resist layer comprises a silicon-containing photo resist layer and said bottom photo resist layer comprises a bottom anti-reflective coating (BARC).

17. The method of claim 16 wherein said silicon-containing photo resist layer comprises 10-30% silicon.

18. The method of claim 16 wherein said bottom anti-reflective coating comprises a 365 nm photo resist layer.

19. The method of claim 11 wherein said first opening does not expose said bottom photo resist layer.

20. The method of claim 19 wherein after forming said first opening, the method further comprises:

etching said silicon photo resist layer comprising said first opening to expose said bottom photo resist layer.

\* \* \* \* \*